United States Patent [19]
Gallagher et al.

[11] Patent Number: 5,452,795
[45] Date of Patent: Sep. 26, 1995

[54] ACTUATED ROTARY RETAINER FOR SILICONE WAFER BOX

[76] Inventors: Gary M. Gallagher, 440F Autumn Ridge Cir., Colorado Springs, Colo. 80906; Boyd C. Wittman, 2707 Northridge Dr., Colorado Springs, Colo. 80918

[21] Appl. No.: 334,949

[22] Filed: Nov. 7, 1994

[51] Int. Cl.[6] ............................. B65D 85/00; B65D 85/48
[52] U.S. Cl. ............................................ 206/711; 206/454
[58] Field of Search .................................. 206/334, 328, 206/454

[56] References Cited

U.S. PATENT DOCUMENTS

| | | | |
|---|---|---|---|
| 4,043,451 | 8/1977 | Johnson | 206/334 |
| 4,061,228 | 12/1977 | Johnson | 206/454 |
| 4,248,346 | 2/1981 | Johnson | 206/334 |
| 4,555,024 | 11/1985 | Voss et al. | 206/454 |
| 4,684,021 | 8/1987 | Niebling et al. | 206/334 |
| 4,718,549 | 1/1988 | Rissotti et al. | 206/334 |
| 4,739,882 | 4/1988 | Parikh et al. | 206/454 |
| 4,752,007 | 6/1988 | Rossi et al. | 206/444 |
| 4,779,724 | 10/1988 | Benz et al. | 206/334 X |
| 4,779,732 | 10/1988 | Boehm et al. | 206/454 |
| 4,793,488 | 12/1988 | Mortensen | 206/454 |
| 4,815,912 | 3/1989 | Maney et al. | 414/217 |
| 4,817,795 | 4/1989 | Kos | 206/328 |
| 4,817,799 | 4/1989 | Gregerson et al. | 206/445 |
| 4,858,764 | 8/1989 | Domokos | 206/449 |
| 4,880,116 | 11/1989 | Kos | 206/454 |
| 4,901,853 | 2/1990 | Maryatt | 206/334 |
| 5,184,723 | 2/1993 | Karl et al. | 206/454 |
| 5,255,783 | 10/1993 | Goodman et al. | 206/334 |
| 5,255,797 | 10/1993 | Kos | 211/41 |
| 5,273,159 | 12/1993 | Gregerson | 206/334 |
| 5,370,142 | 12/1994 | Nishi et al. | 206/454 X |

*Primary Examiner*—Jimmy G. Foster
*Assistant Examiner*—Tara L. Laster
*Attorney, Agent, or Firm*—Haugen and Nikolai

[57] ABSTRACT

A semi-conductor transport container is described, which includes a box, a door and an actuated rotary retainer attached to the sidewall of the box to thereby prevent movement of the wafers within a wafer cassette during transportation and storage. The rotary retainer includes flexible fingers that apply a slight force against the wafers when the box is engaged with the box. The rotary retainer is simple, requires less moving parts, and rotates automatically, completely away from the wafers when the box is disengaged from the door. Also, the box seals with the door, when engaged with a door, thereby creating a particle free storage area.

11 Claims, 5 Drawing Sheets

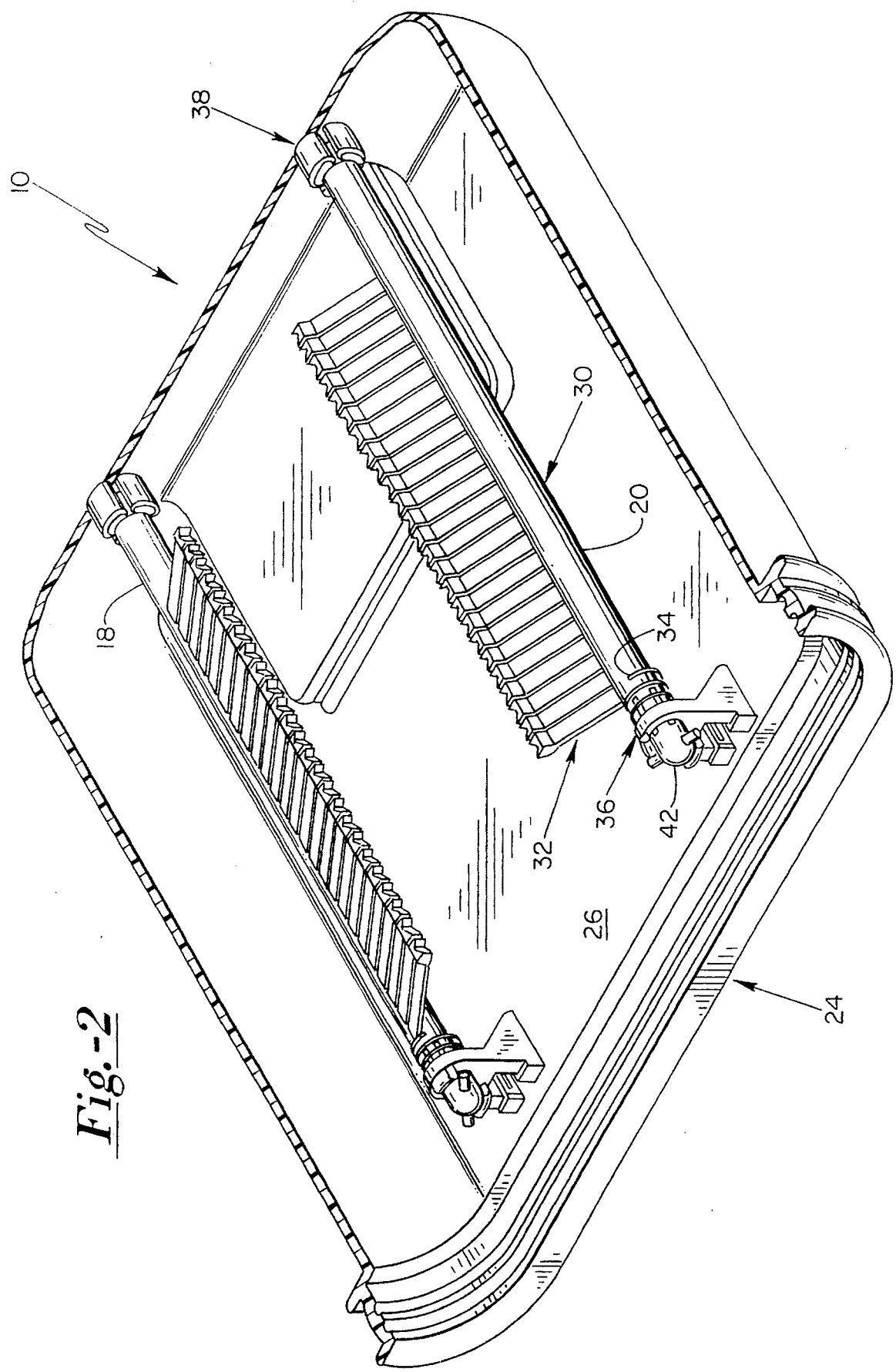

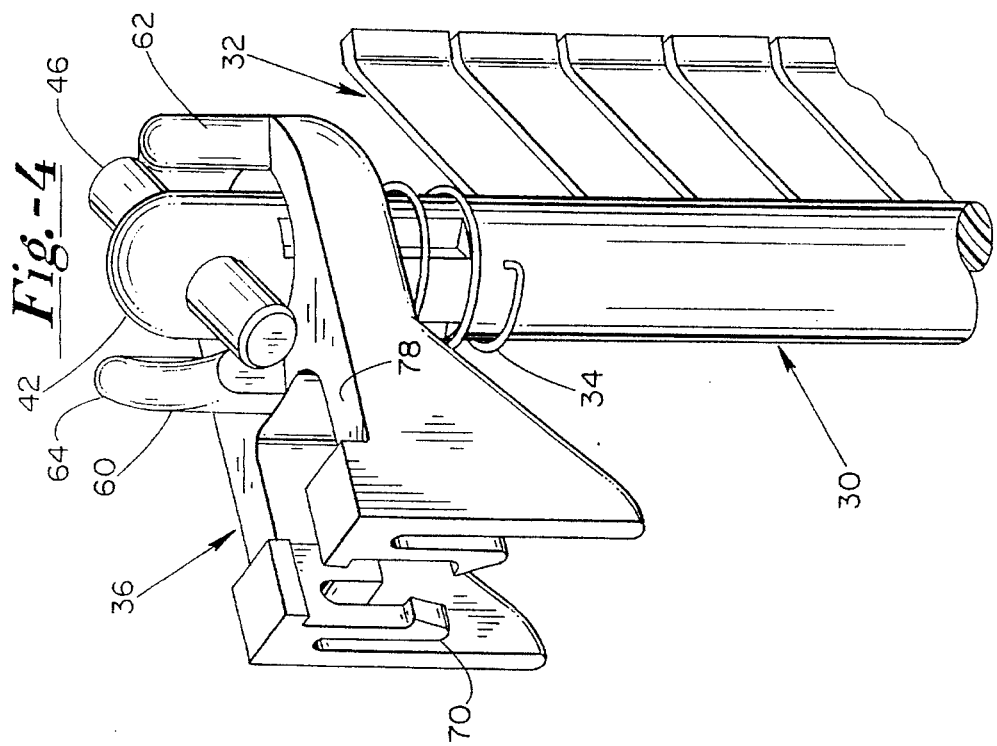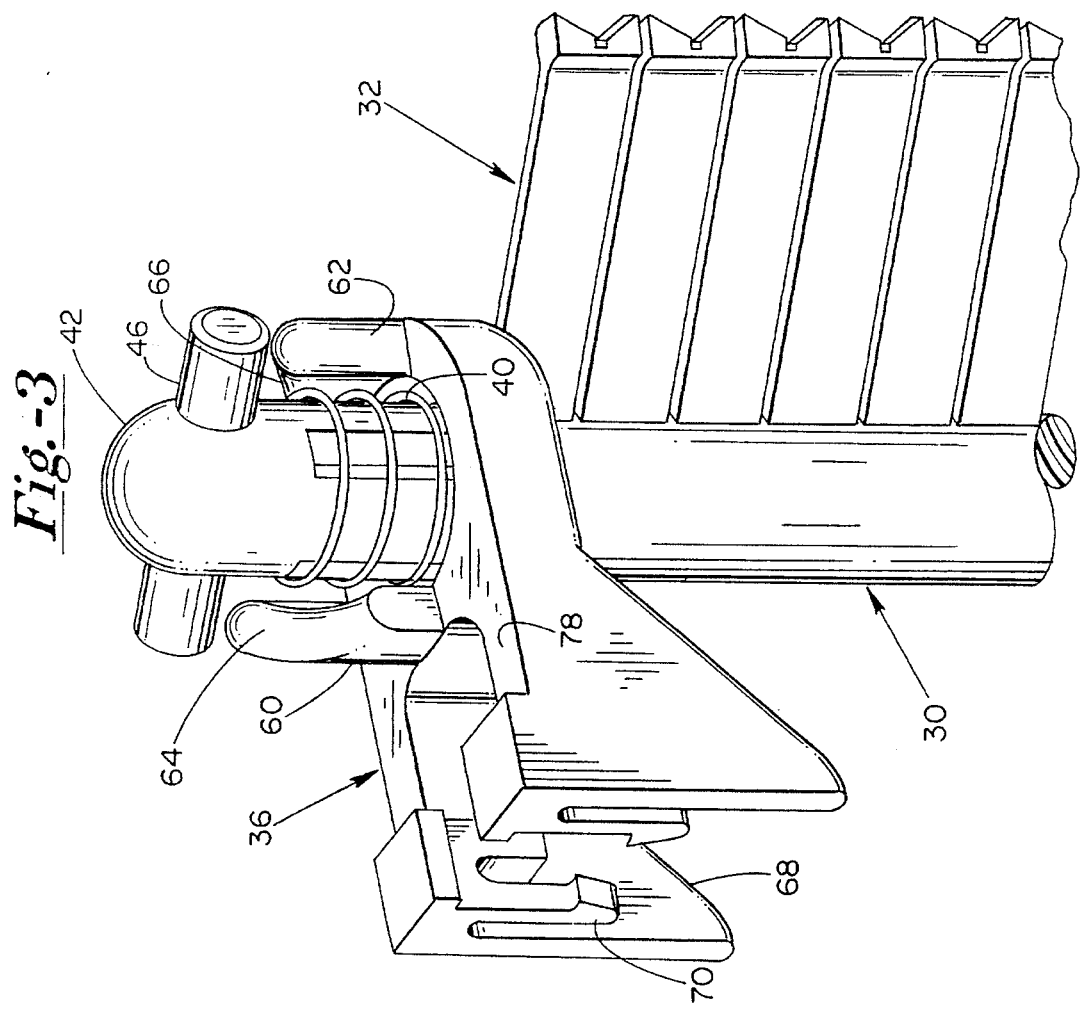

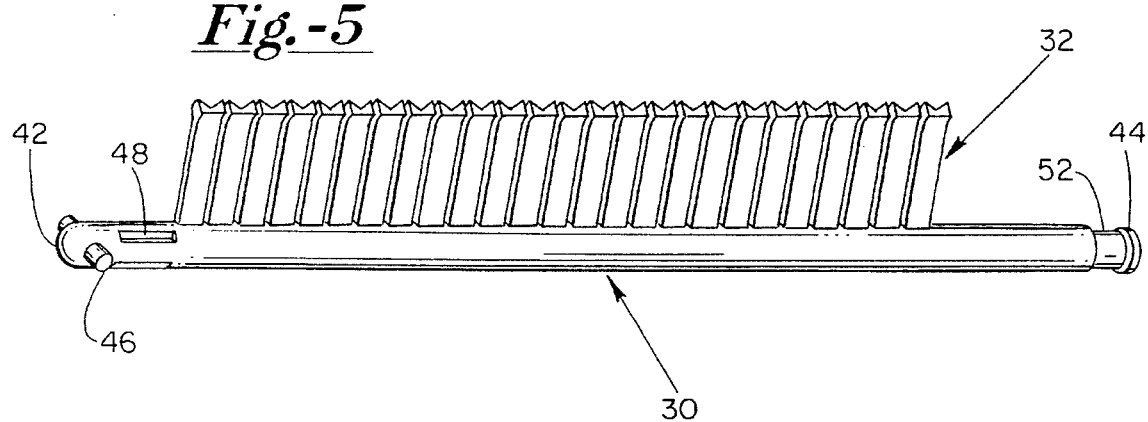
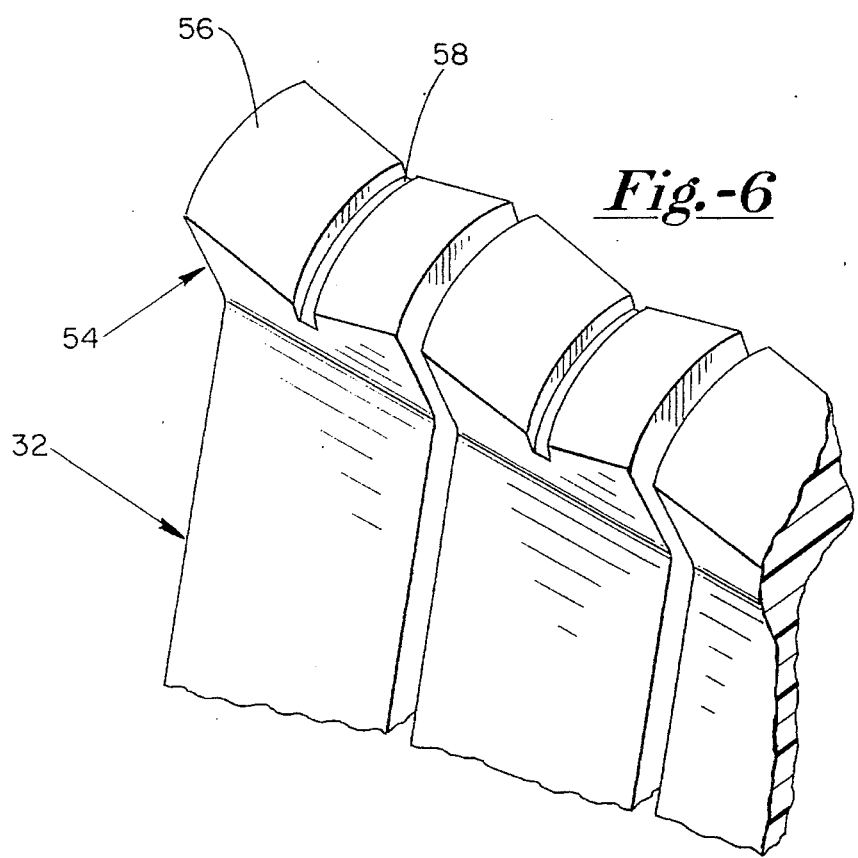

ACTUATED ROTARY RETAINER FOR SILICONE WAFER BOX

BACKGROUND OF THE INVENTION

1. Field of the Invention

This invention relates generally to a semiconductor wafer transport container. More particularly, this invention relates to a semiconductor wafer transport container having a semiconductor wafer cassette and semiconductor wafers enclosed therein; rotary retainers, integral with the container, retain semiconductor wafers within the semiconductor cassette during transportation and storage. The container allows the semiconductor wafer cassette and wafers to be removed from the container, wherein the likelihood of damaging the semiconductor wafers is decreased, without requiring manual manipulation of the container.

2. Discussion of the Related Art

The production of semiconductor wafers requires an extremely clean environment. When transporting and storing the semiconductor wafers, the presence of any small particles, vapors or static discharge in the environment is damaging to the production of the semiconductor wafers, and to the semiconductor wafers themselves. Hence, various techniques are in use today for transporting and storing semiconductor wafers in a particle free environment.

A semiconductor wafer cassette may be securely enclosed within a sealable box known as a WIP box. Semiconductor wafers are placed within the enclosed semiconductor wafer cassette. The semiconductor wafer cassette, the semiconductor wafers, and the inside of the WIP box must all be free of particles damaging to the semiconductor manufacturing process. During transportation of the WIP box, wafers and cassette, any movement of the semiconductor wafers or wafer cassette abrades the contacted surfaces. These abraded surfaces release particulate that is damaging to the wafers. Therefore, there is a need for a transport box which prevents the movement of the wafers within the box.

Also, during the transportation of semiconductor wafers enclosed within a WIP box, the wafers may be damaged from shock or jostling of the box. The jostling of wafers may also cause the release of particulate from abrasion between the wafers and the cassette. To prevent wafer damage and particulate release, the wafers must somehow be held securely within the wafer cassette. In the past, various cushions have been used to press against the wafers, thereby preventing wafer movement within the wafer cassette.

The Kos patent, U.S. Pat. No. 5,255,797, describes cushions that attach to the opposing, outside sidewall of a wafer cassette. The cushions are designed to manually rotate through a slot in the sidewall. Each cushion aligns and engages with a wafer within the cassette. The cushions move in a linear arcuate motion, pivoting around a mounting means that is attached to the cassette side walls. Each cushion of the Kos patent has a pivot pin which is a part of the mounting means. To move the cushions, the operator must manipulate the cushions manually, swinging the cushions through the slot in the cassette's sides.

The manual manipulation of the Kos' cushions requires additional steps to prepare the wafers for transportation and storage. Also, each cushion pivots independently, thereby increasing the surface area subject to abrasions. Hence, there is greater potential for a release of particulate during operation of these cushions. Further, the sidewall slots increases the potential that particulate will reach the semiconductor wafers, causing damage to the semiconductor wafers. Thus there is a need for a cushion that automatically retains the wafers within the cassette without increasing the amount of abraded particulate.

Other various transport containers include a box and door having cushions attached to the inside of the box wall. The cushions hold the semiconductor wafers within the semiconductor wafer cassette. When the box and door are engaged the cushions move inward towards the open end of a properly aligned wafer cassette. One such device was contemplated in the Maney et al patent, U.S. Pat. No. 4,815,912 (the '912 patent). The Maney '912 patent discloses a cushion that is attached to the inside of the box sidewalls by parallelogram arms. When the box and door are engaged, the parallelogram arms swing the cushion upward, towards the wafer. The cushions move in a simultaneously horizontal and vertical linear motion. A force perpendicular to the plane of the wafer is applied by the cushion, when the cushion contacts the wafer's profile edge. This force increases the potential for damage and breakage of the semiconductor wafers. The damage of semiconductor wafers can prove costly to the manufacture of semiconductor wafers. Hence there is a need for a cushion that does not retain the wafers by applying a force perpendicular to the plane of the wafer.

In the Maney transport container, disengaging the box and door causes the cushion to move away from the wafers. As the box is disengaged, a gravitational force moves the cushions away from the wafers. However, the box must be aligned vertically to effectuate the gravitational force. If the container is tilted, the gravitational force may not be sufficient to move the cushions. The fragile wafers are damaged when the cushions do not move completely away from the wafers. Also, depending on the flexibility of the parallelogram arms, gravity may not provide a sufficient force to effectively move the cushions away from the wafers. Further, the cushion may not move far enough away from the wafers to allow the box to be disengaged from the door without careful manipulation. Hence, there is a need for a cushion that automatically restrains the wafers when the box and door are engaged, without an increased likelihood of wafer damage or particulate release. There is a further need for a cushion which automatically retracts completely away from the wafer when the box and door are disengaged.

The present invention overcomes the disadvantages of the current devices by providing a plurality of wafer retaining fingers or cushions that automatically rotate, simultaneously, into contact with the wafers when the box is engaged with the door. The automatic rotational movement, rather than linear motion, sufficiently removes the fingers away from the wafers, when the box and door are disengaged. Also, the present invention is more efficient requiring less manual manipulation. Further, each wafer retaining finger is designed to reduce the amount of abrasion from contact while still holding the wafer in place. Also, the fingers apply a force parallel to the planar surface of the wafers, thereby reducing the risk of damage to the wafers.

SUMMARY OF THE INVENTION

The purpose of the present invention is to provide a container having an automatic retaining device that retains semiconductor wafers within a wafer cassette during transportation and storage. The container is used to store the semiconductor wafer cassette and semiconductor wafers in a clean environment before and after processing of the wafers.

In the preferred embodiment, the container includes a box, a door and a plurality of actuating rotary retainers. The box defines an interior space for containing the semiconductor wafer cassette and semiconductor wafers in a clean environment. The door seals with the box keeping the interior space of the box free of any particles or other contaminants. The rotary retainers extend from the interior space of the box, wherein the wafers, held within a properly aligned wafer cassette, are retained without manual manipulation or risk of damage to the semiconductor wafers.

The rotary retainer consists of first and second bearings, a column or shaft, wafer retaining fingers, and a coil spring. The rotary retainer is positioned on the box sidewall, wherein the shaft bottom contacts the door as the box and door are engaged. The shaft and wafer retaining fingers of the rotary retainer rotates from a first retracted position to a second engaged position. When the box and door are disengaged, shaft and fingers automatically rotate from the second position to the first position. A coil spring may be used to apply an additional rotation force, thereby rotating the shaft and fingers from the second position to the first position. The shaft bottom is spherical, which further minimizes the surface contact, and reduces the potential particulate generation. The first and second bearings, the shaft, and the wafer retaining fingers are designed for aqueous based cleaning as a complete assembly in the box. Hence, all surfaces are sloped, angled or radiused to prevent the cleanser from pooling inside the box.

Those skilled in the art will appreciate that the rotary retainer may be designed to rotate either clockwise or counterclockwise. Without limitation, in the preferred embodiment two rotary retainers are positioned partially opposing each other and attached to the inner sidewall of the box. The opposing rotary retainers rotate from their first position to the second position, thereby engaging the semiconductor wafers edge at partially opposing points along the wafer edge. The wafer retaining fingers of the rotary retainers contact the wafers edge holding the wafer within the wafer cassette. Further, the wafer retaining fingers apply a slight force against the wafers edge parallel with the wafer plane, thereby reducing the risk of damage to the semiconductor wafers.

The wafer retaining fingers of the rotary retainers are designed with an elliptical angled guide or lead-in, which minimizes finger contact with the wafer. Hence, the fingers minimize particulate generation during use. Without limitation, the rotary retainer is molded from a flexible, static dissipative polymer such as Teflon® impregnated polypropylene. Of course, other nonabrasive, flexible, static dissipative polymers may be used.

It is accordingly a principle object of the present invention to provide a container that automatically retains semiconductor wafers within a wafer cassette during the transportation and storage of the wafers.

Another object of the present invention is to reduce the amount of potential abraded particulate, while securely retaining within a container the semiconductor wafer cassette and wafers.

Still another object of the present invention is to provide a container having cushions that automatically rotate away from the wafers when the box and door are disengaged.

Yet another object of the present invention is to provide a rotary retainer that applies a slight retaining force against the wafer edge parallel with the wafer's planar surface, thereby decreasing the potential damage to the fragile wafers.

A further object of the present invention is to provide a rotary retainer that operates independent of the orientation of the door and box.

These and other objects, as well as these and other features and advantages of the present invention, will be readily apparent to those skilled in the art from a review of the following detailed description of the preferred embodiment in conjunction with the accompanying claims and drawings.

DESCRIPTION OF THE DRAWINGS

FIG. 2 is a partial sectional perspective view of two opposing rotary retainers attached to a box, in the second position.

FIG. 3 is a partial perspective view of the shaft, rotatably coupled to the bore of the first bearing, in the first position.

FIG. 4 is a partial perspective view of the shaft, rotatably coupled to the bore of the first bearing, in the second position.

FIG. 5 is a perspective view of the shaft of the type shown in FIG. 2, with wafer retaining fingers attached.

FIG. 6 is a partial sectional exploded perspective view of the tips of the fingers of the type shown in FIG. 5.

DETAILED DESCRIPTION OF THE PREFERRED EMBODIMENT

Figure 1:
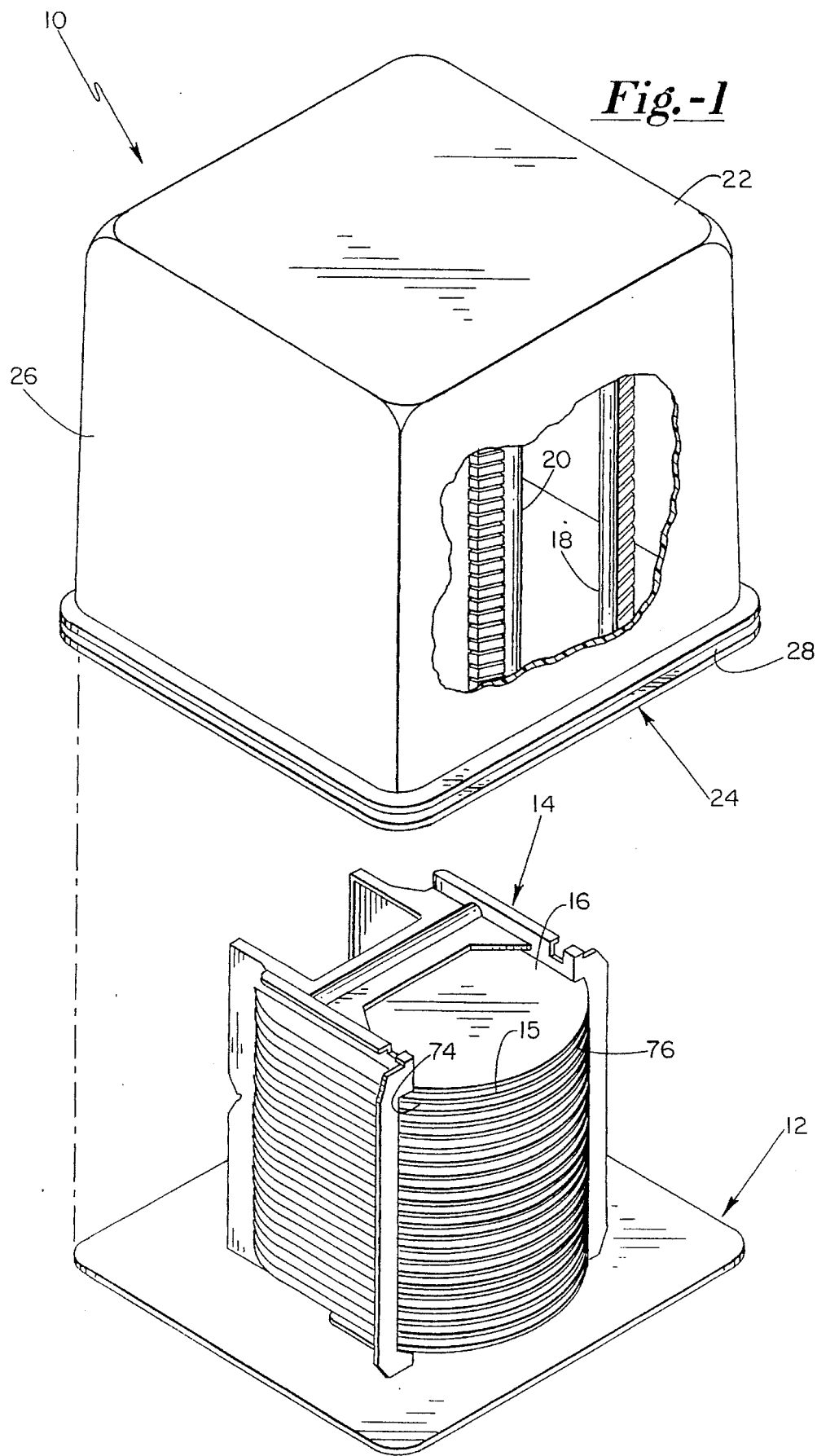
FIG. 1 is a perspective view of a door, a semiconductor wafer cassette positioned on the door, and an elevated and aligned box partially sectioned away to show the shafts and wafer retaining fingers in their retracted first position.

Referring first to FIG. 1, there is indicated generally a box 10, a door 12, a semiconductor wafer cassette 14, semiconductor wafers 16, and right and left rotary retainers 18 and 20. The right rotary retainer 18 is a mirror image of the left rotary retainer 20. The rotary retainers 18 and 20 are attached and extend from the interior of the box 10.

Semiconductor wafers 16 partially extend from the open end of the semiconductor wafer cassette 14. The rotary retainers are shown retracted in a first position. When the box 10 is engaged with the door 12, the rotary retainers rotate simultaneously to a second position (see FIG. 2). When the rotary retainers are in the second position, wafer retaining fingers 32 of rotary retainers 18 and 20 contact the semiconductor wafer's edge 15, holding the wafer 16 within the wafer cassette 14. For clarity and conciseness, the left rotary retainer 20 will be described. Those skilled in the art will appreciate that the description of the left rotary retainer 20 equally applies to the mirror image: the right rotary retainer 18.

The box 10 has a closed top 22, an opening or open bottom 24 which permits the insertion and removal of the semiconductor wafer cassette and semiconductor wafers to or from the box, and a continuous sidewall 26 extending between the closed top 22 and opening 24. A sealing perimeter 28 further defines the opening 24. A door 12 fits within the opening 24 and seals against the inner surface of the sealing perimeter 28.

Referring next to FIGS. 2, 3, and 4, the rotary retainer 18 or 20, consists of a column or elongated shaft 30, fingers 32, a coil spring 34, a first bearing 36, and a second bearing 38. In the preferred embodiment the rotary retainer is attached to the box 10 sidewall 26. The first and second bearings 36 and 38 each have a bore 40 (see FIG. 3). The axis of the bore 40 is aligned perpendicular to the opening 24 of the box 10. Without limitation, the first and second bearing 36 and 38 of the rotary retainer may be fastened, snapped, secured with adhesive, or integrally molded to the box 10.

When the first and second bearings 36 and 38 are properly attached to the box 10, the elongated shaft 30 is rotatably coupled to the bores 40 of the first and second bearings 36 and 38. The shaft 30 is coupled to the first and second bearings, wherein the shaft bottom 42 contacts the door 12 as the box 10 and door 12 are engaged. The shaft 30 rotates through the bore 40 from a first position to a second position, when the box 10 and door 12 are engaged, however the shaft 30 does not contact the inner surface of bore 40. The first and second bearings 36 and 38 are attached to the box 10 inner sidewall 26, whereby the peg 46 of the shaft 30 first comes into slight contact with the bottom 78 and 80 of the sloped rotation members 60 and 62 when the box 10 and door 12 are fully engaged.

Referring next to FIG. 5, the shaft 30 includes a bottom 42, a top 44, a peg 46, and wash slots 48. Wafer retaining fingers 32 extend from the shaft 30 perpendicular to the shaft axis. The shaft bottom 42 comes into direct contact with the door 12. Further, the shaft bottom 42 pivots on the door 12. The pivoting and contact of the shaft and door increases the potential for particulate generation. To reduce the potential particulate generation, the shaft bottom 42 is spherical. In the preferred embodiment, the shaft 30 is cylindrical, allowing the shaft to be cleaned easily with minimal retention of the cleansers. The wash slots 48 are formed near the shaft bottom 42. When the rotary retainer 18 or 20 is assembled, the wash slots 48 allow water to drain through the bore 40 of the first bearing 36, and around the coil spring 34 and shaft 30.

The peg 46 extends perpendicularly from the shaft 30 near the shaft bottom 42. The peg may be formed as part of the shaft or alternately the peg 46 may be tightly pressed through a bore extending through the shaft. The peg 46 is positioned on the shaft 30, wherein the peg contacts the first bearing 36. Along the axis of the shaft 30, wafer retaining fingers 32 extend perpendicularly outward. The fingers 32 retain the semiconductor wafers 16 within the semiconductor wafer cassette 14 when the box 10 is engaged with the door 12. The wafer retaining fingers 32 are positioned on the shaft, whereby, when the box 10 and door 12 are engaged, the fingers 32 align with wafers 16 stored in individual slots of the wafer cassette 14. The shaft top 44 has a recessed shoulder 52 that couples with the bore 40 of the second bearing 38. The shoulder 52 acts as a guide and support for the shaft 30.

Referring next to FIG. 6, the wafer retaining fingers 32 have tips 54 that are designed with an elliptical angled guide or lead-in surface 56, which minimizes finger tip 54 contact with the wafer 16. Hence, the tips 54 minimize particulate generation during use. A notch 58 is formed in the finger tip 54, wherein the notch aids in aligning the wafer 16 with the fingers 32. The wafer retaining fingers 32 are constructed of a flexible polymer, wherein the flexible fingers 32 compensate for the possible wafer 16 diameter variance. The flexible fingers 32 also absorb any movement by the wafers 16. The polymer chosen should also be resistive to surface abrasion, thereby minimizing the amount of generated particulant when the fingers 32 contact the wafers 16. Also, the length of the finger 32 may vary depending upon the diameter of the wafers 16. The finger 32 is longer for smaller diameter wafers 16, and shorter for larger diameter wafers 16. The fingers 32 may be molded integral with the shaft 30 or attached to the shaft; however, an integral shaft 30 and fingers 32 is preferred. Without limitation, the shaft 30 and fingers 32 are molded from a flexible, static dissipative, abrasive resistant polymer such as Teflon® impregnated polypropylene.

Figure 8:
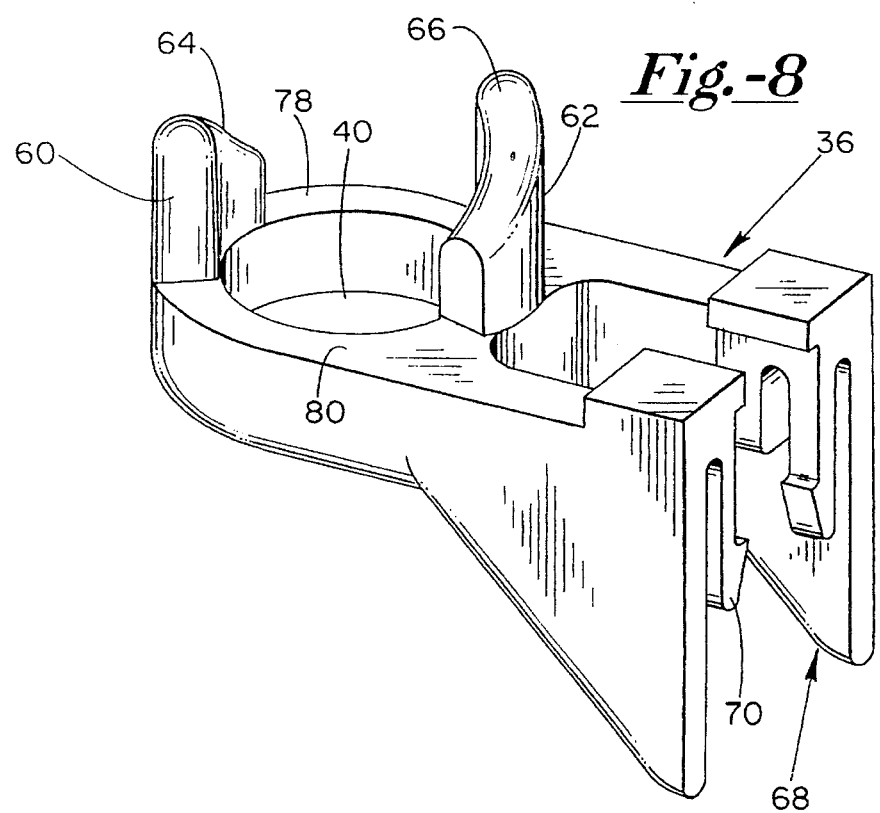
FIG. 8 is a perspective view of a mirror image of the first bearing of the type shown in FIG. 3.

Referring again to FIGS. 3 and 4, first and second sloped rotation members 60 and 62 extend from the first bearing 36, encircling the perimeter of the bore 40. The slope 64 of the first rotation member mirrors the slope 66 of the second rotation member. The peg 46 of the shaft 30 slides along the first and second sloped rotation members 60 and 62 when the box is aligned and engaged with the door. Without limitation, in the preferred embodiment, the peg 46 is cylindrical and first and second rotation member slopes 64 and 66 are elliptical, thereby reducing the surface area of contact when the peg slides along the first and second sloped rotation members 60 and 62. The direction of the slope of the first and second rotation members 60 and 62 determines the direction of rotation. The first bearing 36 shown in FIGS. 3 and 4 rotates the shaft counterclockwise, and the first bearing 36 shown in FIG. 8 rotates the shaft clockwise. To rotate the shaft clockwise the slope is reversed (see FIG. 8).

When the box 10 engages with the door 12, the peg 46 slides along the first and second sloped rotation members 60 and 62. The shaft 30 and wafer retaining fingers 32 rotate from a first position, wherein the fingers 32 are retracted to permit alignment of the box 10 and fingers 32 with the semiconductor wafer cassette 14 and door 12, to a second position, wherein the fingers 32 rotate into engagement with the semiconductor wafers 16. When the box 10 is disengaged from the door 12, the peg 46 slides along the first and second sloped rotation members 60 and 62 rotating the shaft 30 from the second position to the first position. A coil spring 34 is attached to the shaft 30 and first bearing 36. The coil spring 34 applies a rotation force on the shaft 30, rotating the shaft from the second position to the first position when the box and door are disengaged.

Those skilled in the art will recognize that the first and second sloped rotation members 60 and 62 and gravity will rotate the shaft 30 from the second position to the first position, without a coil spring, when the plane of the opening 24 is horizontally aligned. The coil springs 34 eliminates the necessity to horizontally align the box 10 prior to removing the box 10 and door 12. In the preferred embodiment, the user positions the first and second bearings 36 and 38 on the box 10 inner sidewall 26, whereby the peg 46 of the shaft 30 first comes into slight contact with the bottom 78 and 80 of the sloped rotation members 60 and 62 when the box 10 and door 12 are fully engaged. The peg 46, in slight contact with the bottom 78 and 80, hinders the shaft 30 from rotating past the second position. Also, when the box 10 and door 12 are fully engaged, a rotational force against the shaft 30 will not rotate the shaft 30 from the second position toward the first position. Hence, the shaft 30 is effectively locked in place when the box 10 and door 12 are fully engaged. The wafer retaining fingers 32 absorbs force from the wafers 16 when the box 10 is jostled during transportation.

An attachment means 68 for attaching the first bearing 36 to the box 10 extends from the first bearing 36. The attachment means consists of parallely spaced apart hooks 70 that hook onto a mating surface of the box 10. Of course those skilled in the art will recognize that other means to attach the first bearing 36 to the box 10 includes: fasteners, snaps or adhesive. Also, those skilled in the art will appreciate that the first and second bearings 36 and 38 may alternately be molded integral with the box 10, rather than attaching the first and second bearings 36 and 38 to the box.

Figure 7:
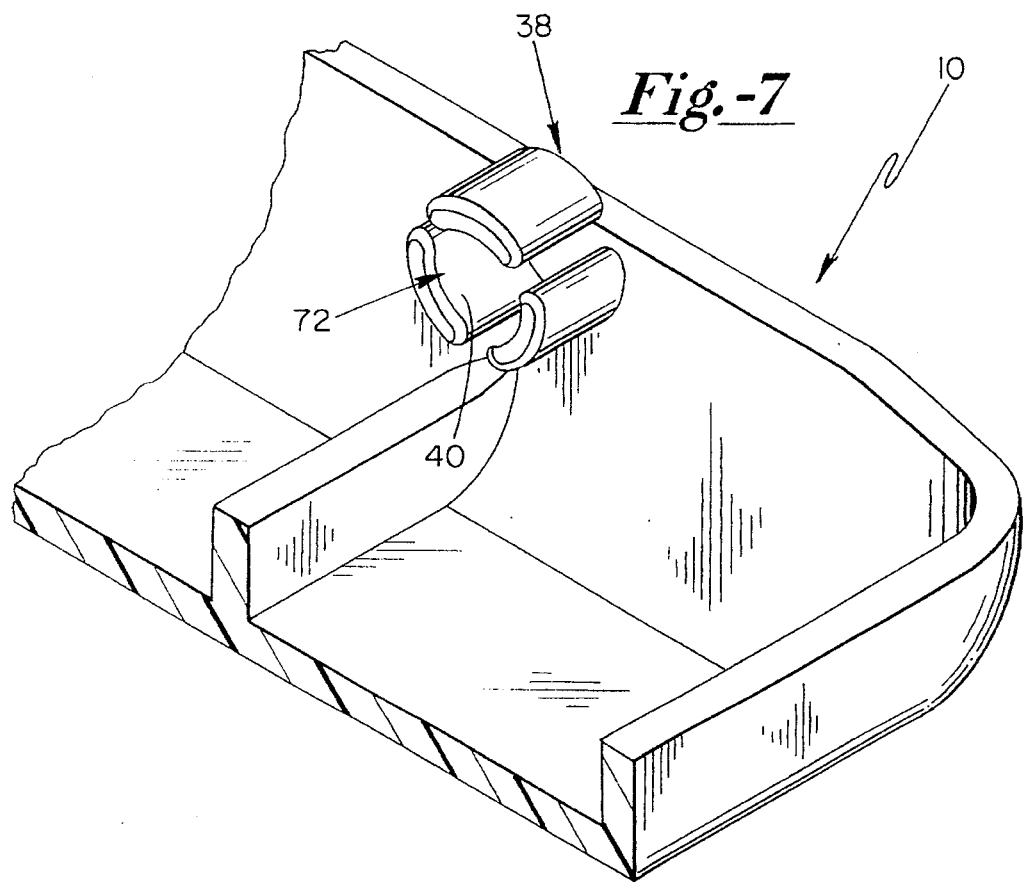
FIG. 7 is a partial sectional perspective view of the box with the second bearing attached to the box.

Referring next to FIG. 7, the second bearing 38 is generally shown attached to the box 10. The second bearing 38 has a recess 72 forming a socket for the top shaft 44 to fit. The recess 72 is cylindrical, thereby allowing the top shaft shoulder 52 to rotate freely within the recess 72. The cylindrical recess 72 also reduces the potential abraded particulate by reducing the total surface area that is in contact with the shaft top 44.

Having described the constructional features of the actuated rotary retainer, the mode of use will now be discussed. Without limitation, the user may form the first and second bearings 36 and 38 integral with the box 10 or attach the first and second bearings 36 and 38 to the box. The first and second bearings are spaced apart such that the shaft 30 may be rotatably coupled to the bores 40 of the first and second bearing 36 and 38. The axis of the shaft 30 is aligned perpendicular to the opening 24 of the box 10. The wafer retaining fingers 32 are positioned on the shaft 30 whereby, when the box 10 is aligned and engaged with the door 12, the fingers align with the semiconductor wafers 16 contained within the semiconductor wafer cassette 14. The wafer retaining fingers 32 are designed and positioned on the shaft 30 so that the fingers 32 do not contact the wafers 16 until the box 10 and door 12 are almost completely engaged. When the fingers 32 engage the wafer 16, a force perpendicular to the wafer edge 15 and parallel to the wafer's planar surface is applied by the fingers. Such a force reduces the chance that the fingers 32 will damage the wafers 16.

Those skilled in the art will recognize that the right and left rotary retainers 18 and 20 may be positioned in the first position on the box 10 opposing each other. When the box 10 is aligned and engaged with the door 12, the shafts 30 and wafer retaining fingers 32 of each rotary retainer 18 and 20 rotate inward to the second position, thereby applying a slight force to the wafer's edge 15 at partially opposing points 74 and 76 along the wafer 16 (see FIG. 1).

In use, the operator places a wafer cassette 14 containing semiconductor wafers 16 securely onto the door 12. The user then covers the door 12 with the box 10. A seal is formed between the box 10 and door 12, preventing entry of particles into the closed box. Prior to the box 10 completely engaging the door 12, the shaft bottom 42 contacts the door 12. As the box 10 engages the door 12, the door applies a force on the shaft 30 parallel to the shaft axis moving the shaft 30 into the box 10. As the shafts 30 move into the box 10, the peg 46 of the shaft 30 slides along the first and second sloped rotation members 60 and 62. As the peg 46 slides along the sloped rotation members 60 and 62, the shaft 30 rotates from a first position to a second position.

When the shaft 30 is in the first position, the wafer retaining fingers 32 are retracted to permit aligning of the box 10 and wafer retaining fingers 32 with the semiconductor wafer cassette 14 and door 12. When the shaft 30 is in the second position, the wafer retaining fingers 32 are in engagement with the semiconductor wafers 16. As the door 12 is disengaged from the box 10, the peg 46 slides along the first and second sloped rotation members 60 and 62, thereby rotating the shaft 30 from the second position to the first position. The coil spring 34 compresses as the shaft 30 rotates from the first position to the second position. The compressed coil spring 34 applies a rotational force and assists in automatically rotating the shaft 30 from the second position to the first position. Proper positioning of the first bearing 36 prevents the shaft 30 from rotating from the second position to the first position before the door 12 is removed from the box 10.

This invention has been described herein in considerable detail in order to comply with the patent statutes and to provide those skilled in the art with the information needed to apply the novel principles and to construct and use such specialized components as required. However, it is to be understood that the invention can be carried out by specifically different equipment and devices, and various modifications, both as to the equipment details and operating procedures, can be accomplished without departing from the scope of the invention itself.

What is claimed is:

1. A container for the transportation and storage of semiconductor wafers positioned within a semiconductor wafer cassette, which holds the semiconductor wafers in the cassette, comprising:

(a) a box having a closed top, a sidewall, an opening to permit insertion and removal of the semiconductor wafer cassette and semiconductor wafers from the box, and a door for closing the opening;

(b) first and second spaced apart aligned bearings each having a bore wherein the axis of the bore is aligned perpendicular to the opening of said box, said first and second bearings being attached to said box;

(c) an elongated shaft rotatably coupled to said bores of said first and second bearings, said elongated shaft extends generally perpendicular to the box opening and having wafer retaining fingers extending along said shaft for retaining the semiconductor wafers within the semiconductor wafer cassette when said box is engaged with said door; and (d) means for rotating said shaft between a first position wherein said wafer retaining fingers are retracted to permit aligning of said box and fingers with the semiconductor wafer cassette and door, and a second position wherein said wafer retaining fingers rotate into engagement with the semiconductor wafers when said box is aligned and engaged with the door.

2. The container as recited in claim 1 wherein said means for rotating said shaft further comprises:

(a) first and second sloped rotation members extending from said first bearing and encircling the perimeter of said bore wherein the slope of said first rotation member mirrors the slope of said second rotation member; and (b) a peg extending perpendicularly from said shaft, wherein said peg slides along said first and second sloped rotation members when said box is aligned and engaged with the door, thereby rotating said shaft from said first position to said second position, said peg slides along said first and second sloped rotation members rotating said shaft from said second position to said first position when said box is disengaged from said door.

3. The container as recited in claim 1 wherein said first bearing further includes an attachment means for attaching the first bearing to the box.

4. The container as recited in claim 2 further including a coil spring attached to said first bearing and said shaft, wherein said coil spring applies a rotation force on said shaft further rotating said shaft from said second position to said first position when said box is disengaged from said door.

5. The container as recited in claim 1 wherein said shaft further has wash slots extending through said shaft.

6. The container as recited in claim 1 wherein said wafer retaining fingers further include tips having an elliptical angled lead-in surface which minimizes the tip contact with the semiconductor wafer when said shaft rotates said fingers into contact with the semiconductor wafers from said first position to said second position.

7. A container for the transportation and storage of semiconductor wafers positioned within a semiconductor wafer cassette, which holds the semiconductor wafers in the cassette, comprising:

(a) a box having a closed top, a sidewall, an opening to permit insertion and removal of the semiconductor wafer cassette and semiconductor wafers from the box, and a door for closing the opening;

(b) first and second spaced apart aligned bearings each having a bore wherein the axis of the bore is aligned perpendicular to the opening of said box, said first and second bearings being attached to said box;

(c) an elongated shaft rotatably coupled to said bores of said first and second bearings, said elongated shaft extends generally perpendicular to the box opening, said elongated shaft having wafer retaining fingers extending from said shaft for retaining the semiconductor wafers within the semiconductor wafer cassette when said box is engaged with said door;

(d) first and second sloped rotation members extending from said first bearing and encircling the perimeter of said bore wherein the slope of said first rotation member mirrors the slope of said second rotation member; and (e) a peg extending perpendicularly from said shaft, wherein said peg slides along said first and second sloped rotation members when said box is aligned and engaged with the door, thereby rotating said shaft from a first position wherein said wafer retaining fingers are retracted to permit aligning of said box and fingers with the semiconductor wafer cassette and door to a second position wherein said wafer retaining fingers rotate into engagement with the semiconductor wafers, said peg slides along said first and second sloped rotation members rotating said shaft from said second position to said first position when said box is disengaged from said door.

8. The container as recited in claim 7 wherein said first bearing further includes an attachment means for attaching the first bearing to the box.

9. The container as recited in claim 7 further including a coil spring attached to said first bearing and said shaft, wherein said coil spring applies a rotation force on said shaft further rotating said shaft from said second position to said first position when said box is disengaged from said door.

10. The container as recited in claim 7 wherein said shaft further has wash slots extending through said shaft.

11. The container as recited in claim 7 wherein said wafer retaining fingers further include tips having an elliptical angled lead-in surface which minimizes the tip contact with the semiconductor wafer when said shaft rotates said fingers into contact with the semiconductor wafers from said first position to said second position.

* * * * *